(12) United States Patent  
Xiao et al.

(10) Patent No.: US 8,044,292 B2
(45) Date of Patent: Oct. 25, 2011

(54) HOMOGENEOUS THERMOELECTRIC NANOCOMPOSITE USING CORE-SHELL NANOPARTICLES

(75) Inventors: Qiangfeng Xiao, New Orleans, LA (US); Yunfeng Lu, New Orleans, LA (US); Junwei Wang, New Orleans, LA (US); Minjuan Zhang, Ann Arbor, MI (US)

(73) Assignees: Toyota Motor Engineering & Manufacturing North America, Inc., Erlanger, KY (US); The Administrators of the Tulane Educational Fund, New Orleans, LA (US)

( * ) Notice: Subject to any disclaimer, the term of this patent is extended or adjusted under 35 U.S.C. 154(b) by 1099 days.

(21) Appl. No.: 11/549,203

(22) Filed: Oct. 13, 2006

(65) Prior Publication Data

US 2008/0087314 A1  Apr. 17, 2008

(51) Int. Cl.  
*H01L 35/34* (2006.01)  
*H01L 35/28* (2006.01)

(52) U.S. Cl. ........ 136/200; 136/236; 136/237; 136/238; 136/239; 136/240.1

(58) Field of Classification Search .................. 136/200, 136/236.1–240  
See application file for complete search history.

(56) References Cited

U.S. PATENT DOCUMENTS

| | | | |
|---|---|---|---|
| 4,611,892 A | | 9/1986 | Kawashima et al. |
| 5,781,395 A | | 7/1998 | Hyatt |
| 6,235,540 B1 | * | 5/2001 | Siiman et al. ................. 436/518 |
| 6,313,392 B1 | * | 11/2001 | Sato et al. ..................... 136/201 |
| 7,259,320 B2 | * | 8/2007 | Take .......................... 136/236.1 |
| 2002/0170590 A1 | | 11/2002 | Heremans et al. |
| 2003/0039744 A1 | | 2/2003 | Fan et al. |
| 2003/0047204 A1 | | 3/2003 | Fleurial et al. |
| 2005/0129580 A1 | * | 6/2005 | Swinehart et al. ............. 422/100 |
| 2006/0102224 A1 | | 5/2006 | Chen et al. |
| 2006/0118158 A1 | | 6/2006 | Zhang et al. |

OTHER PUBLICATIONS

Zhang et al., "Synthesis and characterization of hollow Sb2Se3 nanospheres", Materials Letters, 2004.*  
Sun et al., Colloidal Carbon Spheres and Their Core/Shell Structures with Noble-Metal Nanoparticles, Agnew, 2004.*  
F. Osterloh, H. Hiramatsu, R. Porter, and T. Guo. "Alkanethiol-Induced Structural Rearrangements in Silica—Gold Core—Shell-type Nanoparticle Clusters: An Opportunity for Chemical Sensor Engineering." Langmuir, 2004. vol. 20, pp. 5553-5558.

(Continued)

*Primary Examiner* — Jennifer K. Michener  
*Assistant Examiner* — Matthew Martin  
(74) *Attorney, Agent, or Firm* — Gifford, Krass, Sprinkle, Anderson & Citkowski, P.C.

(57) ABSTRACT

A thermoelectric material comprises core-shell particles having a core formed from a core material and a shell formed from a shell material. In representative examples, the shell material is a material showing an appreciable thermoelectric effect in bulk. The core material preferably has a lower thermal conductivity than the shell material. In representative examples, the core material is an inorganic oxide such as silica or alumina, and the shell material is a chalcogenide semiconductor such as a telluride, for example bismuth telluride. A thermoelectric material including such core-shell particles may have an improved thermoelectric figure of merit compared with a bulk sample of the shell material alone. Embodiments of the invention further include thermoelectric devices using such thermoelectric materials, and preparation techniques. The use of core-shell nanoparticles allows highly uniform nanocomposites to be formed, and embodiments of the invention also includes other materials and devices using core-shell particles.

14 Claims, 11 Drawing Sheets

OTHER PUBLICATIONS

Z. Chen, X. Chen, L. Zheng, T. Gang, T. Cui, K. Zhang, and B. Yang. "A simple and controlled method of preparing uniform Ag midnanoparticles on Tollens-soaked silica spheres." Journal of Colloid and Interface Science, 2005. vol. 285, pp. 146-151.

J. Zhang, J. Liu, S. Wang, P. Zhan, Z. Wang, and N. Ming. "Facile Methods to Coat Polystyrene and Silica Colloids with Metal." Advanced Functional Materials, 2004. vol. 14, No. 11, November pp. 1089-1096.

* cited by examiner

HOMOGENEOUS THERMOELECTRIC NANOCOMPOSITE USING CORE-SHELL NANOPARTICLES

FIELD OF THE INVENTION

The present invention relates to thermoelectric materials and devices, in particular to homogeneous nanocomposite thermoelectric materials using core-shell particles, and their methods of preparation.

BACKGROUND OF THE INVENTION

Nanostructured materials may be difficult and/or expensive to manufacture, and it may be difficult to obtain uniform properties in a composite material. In particular, improved approaches to obtaining homogeneous nanostructured thermoelectric materials with controlled structure will help commercial applications to be achieved.

Further, nanostructured materials have numerous applications, and improved control of homogeneity or other material parameters would be very useful.

SUMMARY OF THE INVENTION

A thermoelectric material according to embodiments of the present invention comprises a plurality of core-shell particles, the core-shell particles having a core formed from a core material, and a shell formed from a shell material.

For thermoelectric applications, the shell material is preferably a material that shows an appreciable thermoelectric effect when in bulk, such as a chalcogenide semiconductor, for example bismuth telluride or lead telluride based materials. Other example shell materials include: metals or semimetals (including alloys), compounds of silicon and germanium; skutterudites typed material such as $CoSb_3$ based, rare-earth intermetallics such as $YbAl_3$; clathrate structure materials (such as Si, Ge or Sn framework based materials); half-heusler alloys (e.g., MNiSn (M=Zr, Hf, Ti); multicomponent metal oxides such as $NaCo_2O_4$, $Ca_3Co_4O_9$; and other known thermoelectric materials.

Examples of the present invention include homogeneous nanocomposite thermoelectric materials formed from such core-shell particles, having uniform and improved thermoelectric figure of merit compared with an inhomogeneous mixing of separate particles of the core and shell material or a conventional bulk sample of the shell material. In some examples, the core comprises a material having a thermal conductivity less than the shell material. In representative examples, the core material is a low thermal ceramic material, for example silica, alumina, $TiO_2$, $ZrO_2$ and the like. In other examples, the core can be materials such as metal, carbon (such as graphitic carbon), polymer, air and other different thermoelectric material from the shell material or their combinations.

The shell preferably has a thickness in the range between approximately 0.5 nm to 10 micron, and more particularly between approximately 1 nm to approximately 500 nm. In some examples of the present invention, quantum size effects of the core-shell particles advantageously dominate the thermoelectric properties of the homogeneous nanocomposite materials. The term core-shell particle also includes hollow-shell particles, which have a core of air, other gas, liquid, or vacuum.

A thermoelectric device according to an embodiment of the present invention includes at least one thermoelectric unicouple comprising a first electrical contact, a second electrical contact, and a thermoelectric material located in the electrical path between the first electrical contact and the second electrical contact, the thermoelectric material comprising a plurality of core-shell particles. Thermoelectric devices including thermoelectric materials according to the present invention may be Peltier or Seebeck devices.

An example method of making a thermoelectric material comprises providing a plurality of core particles, the core particles comprising a core material, functionalizing the surface of each core particle, growing a shell on the functionalized surface of each particle to provide a plurality of core-shell particles, and consolidating the core-shell particles so produced into a thermoelectric material. The consolidation may include the application of heat and/or pressure to the core-shell particles, or may merely involve drying, purification, and the like. The core-shell particles may be combined with additional materials, such as other nanoparticles, before consolidation.

An example method of preparing core-shell particles comprises functionalizing the surface of particles of a core material, and growing a shell of a shell material on the core material. In particular examples, the core material is carbon or a polysugar, and the shell material is a semiconductor such as lead telluride.

DETAILED DESCRIPTION OF THE INVENTION

Figure 1:
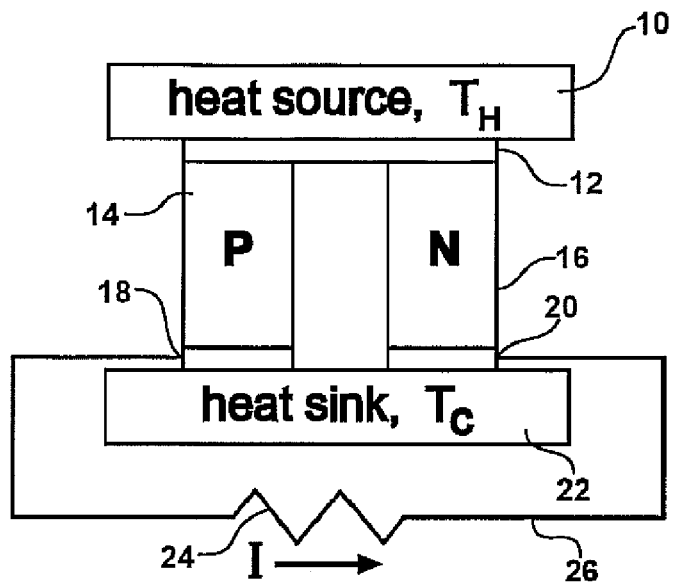
FIG. 1 illustrates a thermoelectric device configuration.

Embodiments of the present invention relate to thermoelectric materials, in particular to thermoelectric materials including core-shell particles, thermoelectric devices including such thermoelectric materials, and methods of preparation.

The term "bulk thermoelectric material" refers to a material that has appreciable thermoelectric behavior in a homogeneous bulk form. Such materials may be used as a shell material in a core-shell particle, for inclusion in a thermoelectric material. Unless otherwise indicated, the term "thermoelectric material" is used to refer to a thermoelectric material according to an embodiment of the present invention. Such thermoelectric materials are exemplary, and should not be used to restrict the scope of the invention, which is defined by the claims.

Thermoelectric material according to embodiments of the present invention comprises core-shell particles. A core-shell particle comprises at least two components, a core material and a shell material. Representative examples include particles each having a silica core and a $Bi_2Te_3$ shell. In other examples, the shell material may be an alloy of bismuth telluride and antimony, or other material having an appreciable thermoelectric effect in bulk.

A thermoelectric material comprising core-shell nanoparticles can provide an improved thermoelectric figure of merit, compared with the figure of merit of a bulk sample of the shell material. The enhancement may be due to the combination of a low thermal conductivity, high electrical conductivity, and high Seebeck coefficient.

Quantum confinement effects due to the restricted dimensions of the shell can further increase the figure of merit of the composite thermoelectric material. However, thermoelectric materials according to the present invention may include core-shell particles where the shell thickness is too thick for appreciable quantum effects.

An example thermoelectric device according to an embodiment of the present invention includes a first electrical contact, a second electrical contact, and a thermoelectric material located within an electrical path between the first electrical contact and the second electrical contact. The thermoelectric material includes a plurality of particles each having a core formed from a core material, and a shell formed from a shell material surrounding the core.

Example core materials include stable solid materials, such as metal, ceramic, carbon, polymer, or combination thereof. Possible core materials also include air (for example, an air-filled core within a hollow shell, or foam-like core including a plurality of voids within a shell).

A figure of merit, Z, for a thermoelectric material may be defined as $Z=S^2\sigma/\kappa$, in terms of Seebeck coefficient (S), electrical conductivity ($\sigma$), and thermal conductivity ($\kappa$). An alternative dimensionless figure-of-merit is ZT, as Z varies with temperature. For a typical homogeneous bulk thermoelectric materials, such as alloys of bismuth telluride and antimony, ZT is typically less than 1. The figure of merit may be improved by increasing S and/or $\sigma$, and/or lowering $\kappa$. However, for a homogeneous bulk material, thermal conductivity and electrical conductivity are often correlated, so that increasing electrical conductivity also increases thermal conductivity, and the effects of both increases tend to cancel out in the figure of merit.

A thermoelectric material according to the present invention may have a high electrical conductivity ($\sigma$) due to interconnecting semiconductor (or other electrical conductor, such as metal) network, such as shells of core-shell particles. Optionally, the thermoelectric material may have an enhanced value of Seebeck coefficient (S) due to the enhancement of the density of states near the Fermi level arising from quantum confinement effects, for example when the shell has a shell thickness in the tens of nanometers, or less. The thermoelectric material may at the same time have a low value of thermal conductivity$\kappa$, compared to a bulk homogeneous sample of the shell material, because of the lower thermal conductivity of the core material, compared with the shell material. The thermal conductivity may be further reduced due to increased phonon scattering at the core-shell boundary, and possibly other boundaries or scattering locations within the material. Hence, a nanocomposite thermoelectric material including core-shell particles may have higher figure of merit, ZT, than a homogeneous bulk sample of the shell material used.

Conventional thermoelectric materials typically have a dimensionless figure of merit ZT less than 1 in bulk, and any such material may be used as a shell material (and/or core material) in an example of the present invention.

FIG. 1 illustrates a configuration of a thermoelectric device using an improved thermoelectric material according to an example of the present invention.

The device includes heat source 10, first electrically conducting layer 12, first thermoelectric material 14, second thermoelectric material 16, first electrical contact 18, second electrical contact 20, heat sink 22, and resistive load 24 connected to the thermoelectric device through electrical lead 26. When heat is provided by the heat source ($T_H > T_C$), current is generated in the direction shown in FIG. 1. Hence, this thermoelectric device is a Seebeck thermoelectric device, producing an electrical output from a heat input.

In this example, the first thermoelectric material includes an n-type semiconductor, and the second thermoelectric material includes a p-type semiconductor. The first thermoelectric material and/or the second thermoelectric material comprise a thermoelectric nanocomposite including core-shell particles. In an example where the first thermoelectric material includes core-shell particles, the shell material of these particles may comprise an n-type semiconductor, and in an example where the second thermoelectric material includes core-shell particles, the shell material of these particles may comprise a p-type semiconductor.

A similar configuration may be used to obtain Peltier heating or cooling, where an electrical potential is applied between the first and second electrical contacts so as to generate a thermal gradient in the device. For conciseness, this specification discusses the Seebeck effect (electricity obtained from thermal inputs), but in general the same considerations, such as figure of merit ZT, apply equally to Peltier device applications.

Figure 2A:
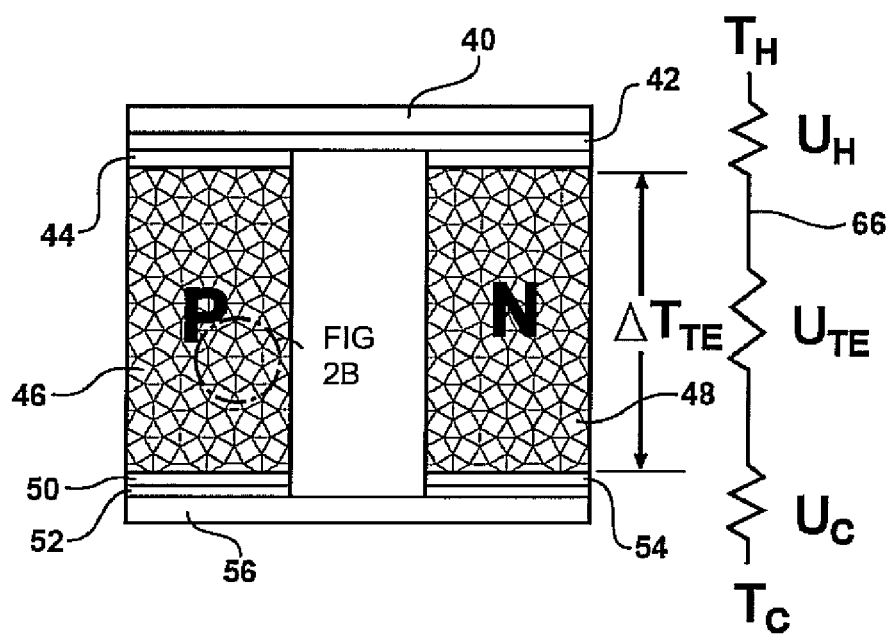
FIG. 2A illustrates a unicouple from a thermoelectric device.

FIG. 2A shows a thermoelectric device, in this case a thermoelectric unicouple including a first ceramic layer 40, which can be placed in thermal communication with a heat source, metal layer 42, first and second thermoelectric materials 46 and 48, having nickel electrical pads such as 44 and 50, first and second electrical contacts 52 and 54 respectively, and second ceramic layer 56, which can be placed in thermal communication with a heat sink. The thermoelectric materials each includes a plurality of core-shell particles, which form a conducting network shown schematically in this figure.

FIG. 2A also shows a thermal circuit 66 corresponding to this unicouple contains the thermal resistances for the transfer of heat from the hot reservoir $U_H$, to the cold reservoir $U_C$, and through the thermoelectric legs $U_{TE}$. $U_{TE} = L/\sigma A$ where L is the length of the legs, A is the cross-sectional area and $\sigma$ is the thermal conductivity. $U_H$ and $U_C$ contain the thermal resistance of the ceramic plate, as well as the coefficient of heat transfer from the hot side and to the cold reservoir.

Figure 2B:
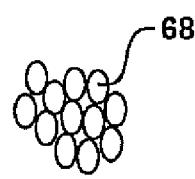
FIG. 2B illustrates core-shell particles within a thermoelectric material.

FIG. 2B shows a detail of the thermoelectric material including the core shell particles such as 68.

Figure 3A:
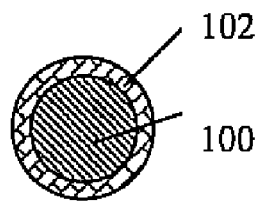
FIGS. 3A-3E illustrate example core-shell particles in cross-section.
Figure 3B:
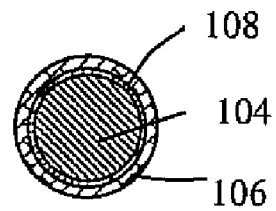
Figure 3C:
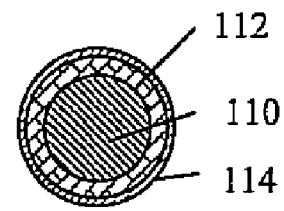
Figure 3D:
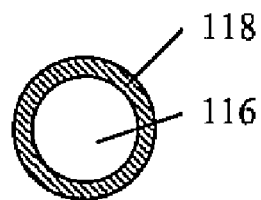
Figure 3E:
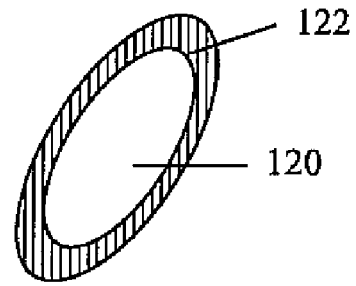

FIGS. 3A-3E illustrates different core-shell particles that may be used in thermoelectric materials according to examples of the present invention. FIG. 3A illustrates a particle having a generally spherical core 100 supporting an outer shell 102. The core comprises core material, and the shell comprises shell material. The core may also comprise one or more voids, or be air. FIG. 3B illustrates a particle having a generally spherical core 104 supporting an outer shell 106, there being an intermediate layer 108 between the core and the shell. The intermediate layer may arise from functionalization of the core, or be provided for another purpose. FIG. 3C illustrates a particle having a generally spherical core 110 supporting an outer shell 112, the shell having an outer coating 114. The outer coating may be provided to assist consolidation of the particles, inter-shell conduction, or other purpose. For example, the outer coating may be a thin metal film. FIG. 3D illustrates a hollow particle with air inside as core 116, and shell 118. The core need not be spherical, and may be elongated, even rod shaped or other shape. FIG. 3E shows an ovoid core 120, and shell 122.

A core may support a plurality of shell layers, for example multiple shell layers may be arranged in a superlattice configuration. The core may be non-homogeneous, for example including an inner core and an outer core, the outer core being selected for ready formation of the shell layer thereon, the inner core being selected on some other basis, for example low thermal conductivity, porosity, low cost, or other factor or combination of factors.

Fabrication of Core-shell Nanoparticles

Core-shell nanoparticles were synthesized by preparing functionalized silica nanoparticles (cores), with the subsequent growth of a thermoelectric shell, such as $Bi_2Te_3$ or PbTe shells on the functionalized surface of the core. Monodisperse silica nanoparticles were prepared by hydrolysis and condensation reactions of alkoxysilanes in a mixture of alcohol, water, and ammonia. Subsequent surface modification of the silica nanoparticles was achieved using ω-terminated trialkoxyorganosilanes.

An efficient approach was developed to synthesize $Bi_2Te_3$ and PbTe nanostructures in aqueous media, by reacting NaHTe with $Bi^{3+}$ and $Pb^{2+}$ complexes at ambient conditions. An analogous approach was used to form $Bi_2Te_3$ shells on silica cores that were functionalized with 3-mercaptopropyl groups, these organic ligands being capable of forming complexes with $Bi^{3+}$ ions. This approach may also be used to prepare PbTe shells and other telluride shells. Reacting the solutions containing the 3-mercaptopropyl modified silica particles and a $Bi^{3+}$ source with NaHTe in aqueous media resulted in rapid formation of thermoelectric core-shell particles having a silica core and a bismuth telluride shell.

EXAMPLE 1

Preparation of Core-shell Nanoparticles Using MPS-functionalized Silica Cores

Preparation of Silica Cores: Silica spheres were prepared by reacting TEOS in a mixture of ethanol, water and ammonia according to the Stober method. Silica spheres with different sizes were achieved by adjusting the ratios of the reactants, reaction time and temperature. Typically, for the synthesis of ~200 nm silica particles, 2 mL of 30% ammonia, 3 mL of distilled 50 mL ethanol, and 1.5 mL of TEOS was mixed and stirred for 12 h at room temperature. The particles were collected by centrifugation and redispersed in ethanol or distilled water at least three times to remove any excess reactants. The silica particles solutions were then allowed to react with MPS or APS overnight, centrifuged and redispersed in ethanol at least five times to remove the unreacted MPS. Finally, the functionalized silica spheres were redispersed in distilled water for further use. The resulting particles were stable for at least several months.

Preparation of Bi-EDTA Complex and NaHTe: 0.1202 g EDTA, 15 mL distilled water, 1 mL of 5% ammonia, and 0.032 g bismuth nitrate pentahydrate were mixed under sonication, resulting in a clear solution. The pH of the Bi-EDTA complex solution was then adjusted to 8-9 using hydrochloric acid. Sodium hydrogen telluride (NaHTe) was prepared by reacting sodium borohydride with tellurium in water with a molar ratio of 2:1 Typically, 80 mg sodium borohydride, 1 mL distilled water, and 127 mg Te powder were reacted in the flask at zero degree for 8 h. The resulted NaHTe from the clear supernatant was then separated for further use.

The Bi-EDTA complex solution was added drop-wise into a solution containing the functionalized silica particles. The mixture was then heated to 70° C. to promote the complexation of bismuth to the particle surface. NaHTe solution was then added to the particle-containing solution under nitrogen. As formed core-shell nanoparticles were collected, washed with distilled water and ethanol, and dried for future use.

Figure 4A:
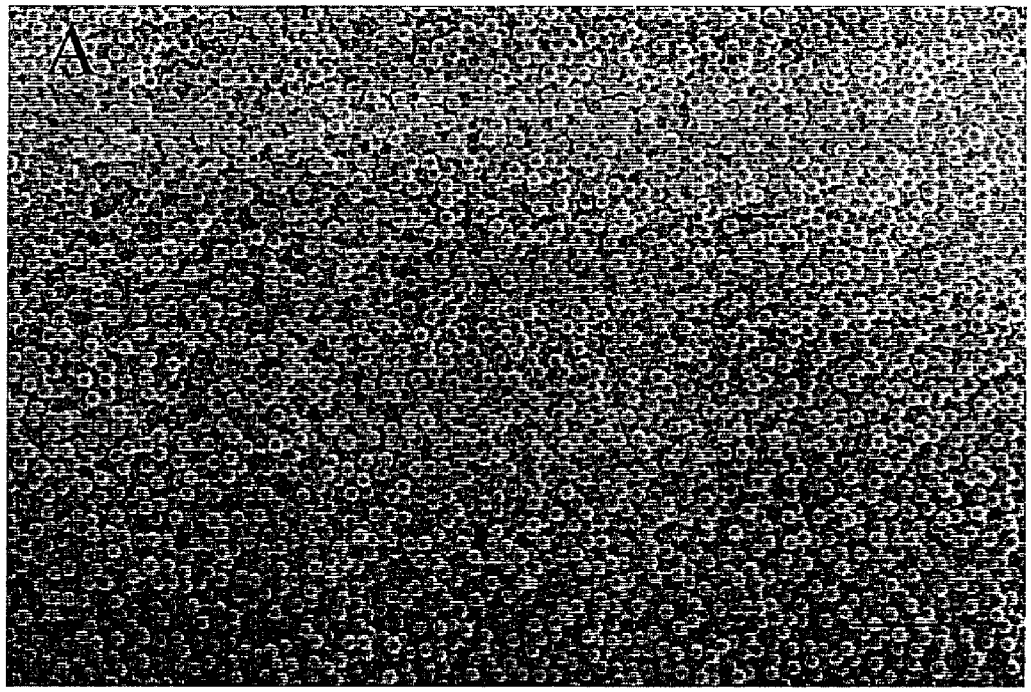
FIGS. 4A-4B show representative SEM images of functionalized silica nanoparticles.
Figure 4B:
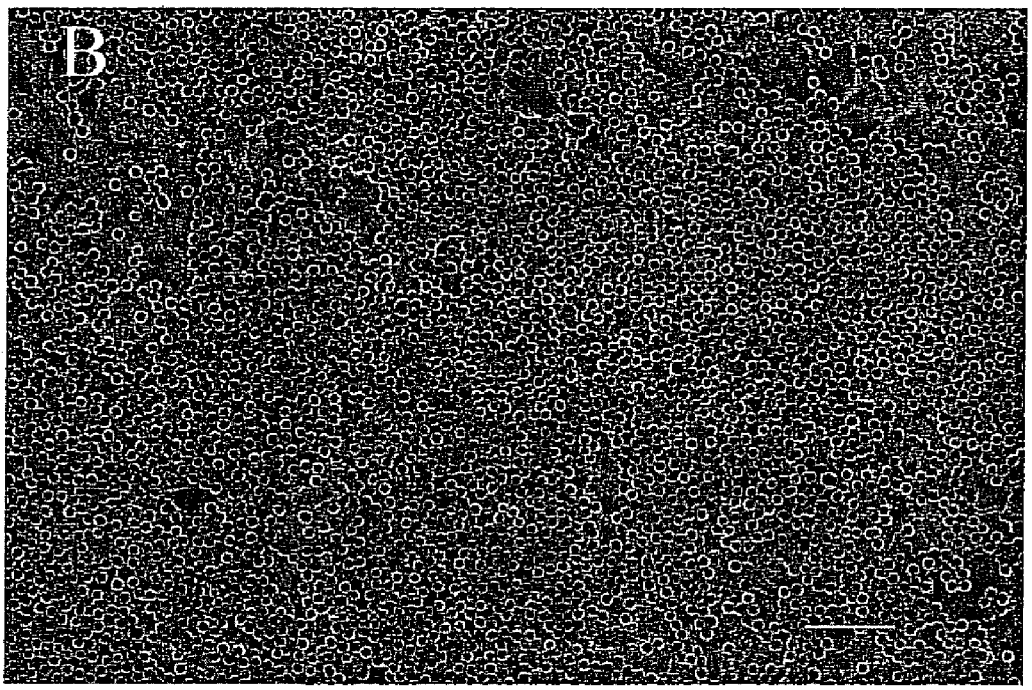

FIGS. 4A-4B show representative SEM images of the MPS-functionalized $SiO_2$ nanoparticles with 450 nm and 240 nm diameter, respectively. In these figures, the bar represents 3 μm. Monodispersed silica particles with diameters tunable from 20 to 500 nm could be prepared by simply adjusting the reactant concentration and reaction condition. Functionalization of these spheres with MPS does not influence their size and dispersity as indicated by the SEM images. FTIR spectra of these particles confirmed the presence of the covalently bound organic moieties, indicating the success preparation of the functional particles. Adding NaHTe into the mixtures containing Bi-EDTA complexes and the MPS-modified silica particles initiates the heterogeneous and homogenous growth of $Bi_2Te_3$ respectively on the functionalized particle surface and in the solution. As a result, both core-shell particles and homogenous $Bi_2Te_3$ nanoparticles were formed simultaneously.

Figure 5A:
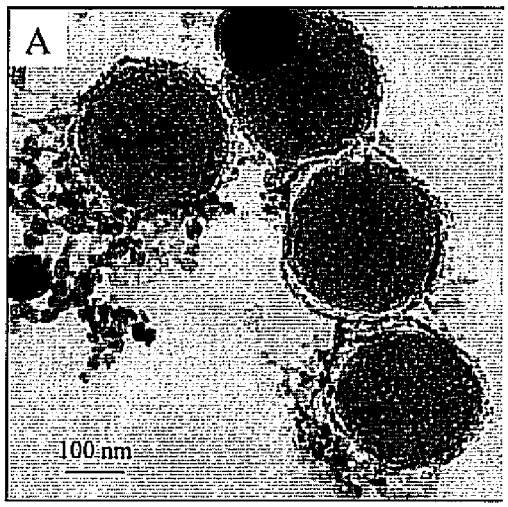
FIGS. 5A-5C show TEM images of core-shell nanoparticles with silica cores and $Bi_2Te_3$ shells.
Figure 5B:
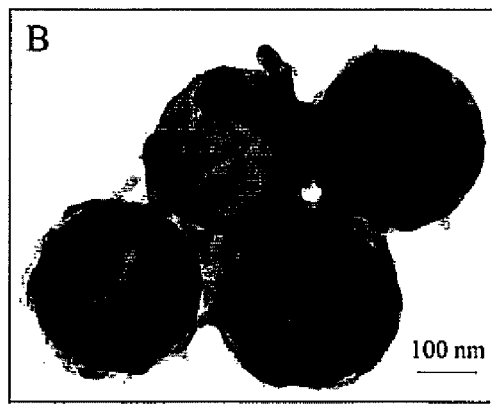
Figure 5C:
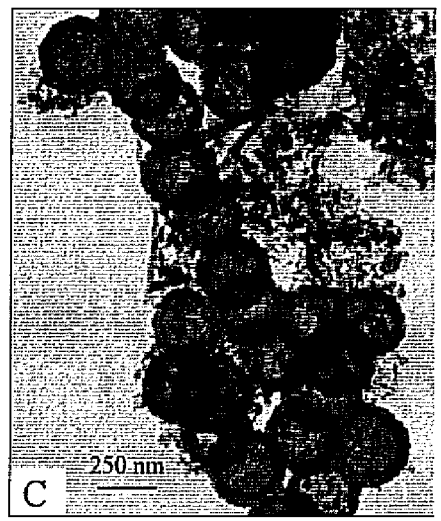

FIG. 5A-5C show TEM images of core-shell nanoparticles with 240 nm silica particle cores and $Bi_2Te_3$ shells. FIG. 5A shows particles with 5 nm $Bi_2Te_3$ shells, FIG. 5B shows particles with 40 nm $Bi_2Te_3$ shells, and FIG. 5C shows particles with 40 nm $Bi_2Te_3$ shells after annealing at 300° C. for 10 min The shell thickness can be controlled from several nanometers to tens of nanometers by adjusting the ratio of thiol-terminated silica spheres to the bismuth complex. FIG. 5A displays the core-shell particles prepared by adding functionalized particles (240 nm in diameter) into bismuth complex ($5 \times 10^{-3}$ M). It clearly indicates the formation of core-shell structure with 5 nm thick $Bi_2Te_3$ shells. FIG. 5A also indicates the formation of $Bi_2Te_3$ nanoparticle networks that are consisted with nanoparticles with diameters around 20 to 30 nm. Increasing the bismuth complex concentration to 0.05M resulted in the formation of core-shell particles with a thicker $Bi_2Te_3$ shell of 40 nm (see the TEM image in FIG. 5B). To further consolidate the shell, the core-shell particles were annealed at 300° C. for 10 min in nitrogen. FIG. 5C shows TEM image of the annealed sample indicating well defined shell structure.

The formation mechanism may involve the nucleation of $Bi_2Te_3$ clusters on the functionalized core surface followed by a continuous shell growth. Providing functional groups such as organic ligands on the silica core surface is useful for forming these core-shell nanoparticles.

Figure 6A:
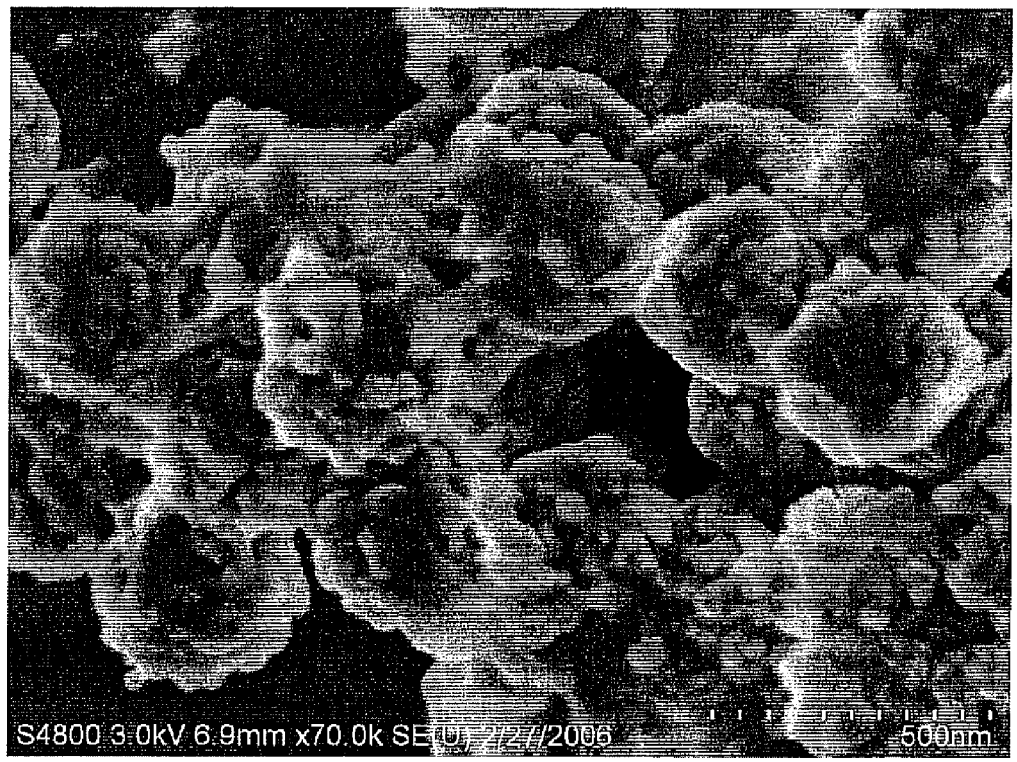
FIGS. 6A-6B show SEM images of core-shell particles formed using mercaptopropyl functionalized silica particles (FIG. 6A) and aminopropyl functionalized silica particles (FIG. 6B)
Figure 6B:
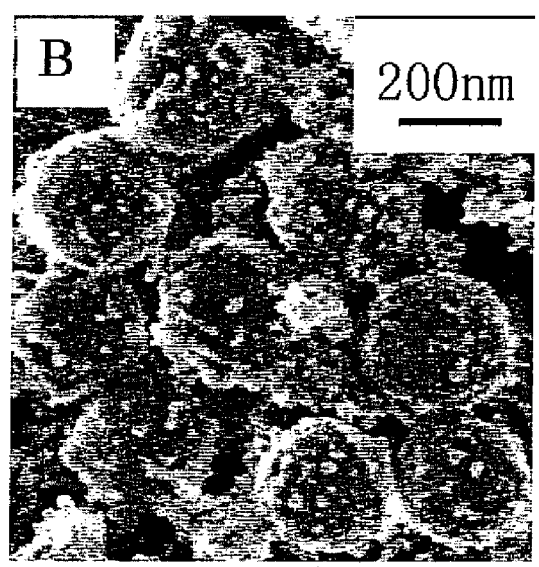

FIGS. 6A-6B compare the use of surface aminopropyl and mercaptopropyl groups. SEM images show the particles formed by reacting the mercaptopropyl functionalized silica particles FIG. 6A) and the aminopropyl functionalized silica particles (FIG. 6B) and with NaHTe in the presence of Bi-EDTA complex. b FIG. 6B, scattering $Bi_2Te_3$ nanoparticles can be observed on the aminopropyl functionalized silica particles, while a heavy coverage of $Bi_2Te_3$ can be clearly observed on the mercaptopropyl functionalized silica particles. Such a difference is attributed to the stronger chelating capability of the mercaptopropyl groups, which adsorbs a higher concentration of Bi ions on the silica surface. These results suggest that stronger chelating surface groups promote the heterogeneous growth of $Bi_2Te_3$ particles on the silica surface, which favors the formation of the core-shell structure.

EXAMPLE 2

Poly(acrylic Acid) Functionalized Silica Particles

Another approach to synthesize core-shell thermoelectric particles was developed using poly(acrylic acid) functionalized silica particles as cores. This was achieved by covalently bonding poly(acrylic acid) (PAA) with the amine-functionalized silica particles using 4-(4,6-dimethoxy-1,3,5-triazin-2-yl)-4-methylmorpholinium chloride (DMT-MM). Uniform, high-coverage thermoelectric material shells on silica cores were obtained using these carboxylic terminated silica spheres as core materials. Annealing the particles at moderate temperatures under nitrogen or hydrogen resulted in the formation of core-shell $SiO_2@Bi_2Te_3$ particles with a well-crystallized $Bi_2Te_3$ shell.

Tetraethyl orthosilicate (TEOS, 98%), 3-aminopropyltrimethoxysilane (APS, 95%), poly (acrylic acid) (PAA), polyvinylpyrrolidone (10,000, PVP), ammonia (28-30%), ethanol (200 proof), bismuth nitrite pentahydrate (98%), sodium borohydride (98%), tellurium (99.8%) were purchased form Aldrich. 4-(4,6-dimethoxy-1,3,5-triazin-2-yl)-4-methylmorpholinium chloride (DMT-MM, 98.0%), Ethylenediaminetetraacetic acid CEDTA, 99.0%) was obtained from Fluka. All chemicals were used as received. Highly pure water was obtained from a Millipore Milli-Q UV system.

Preparation and surface-functionalization of Silica Cores: As in the first example, silica spheres were prepared by reacting TEOS in a mixture of ethanol, water and ammonia according to the Stober method. Typically, for the synthesis of ~200 nm silica particles used for these experiments, 50 mL ethanol, 2 mL of 30% ammonia, and 1.5 µL of TEOS were mixed and stirred for 12 h at room temperature. The particles were collected by centrifugation and re-dispersed in ethanol or distilled water at least three times to remove any excess reactants.

The silica particles solution was then allowed to react with 60 µL APS overnight, centrifuged and re-dispersed in ethanol at least five times to remove the unreacted APS. After then, 71 mg DMT-M and 18 mg PAA were added into the amino-functionalized silica spheres solution, with stirring for 12 h at room temperature. The solution was then centrifuged and re-dispersed in ethanol at least five times to remove excess reactants.

The Bi-EDTA complex and NaHTe were prepared as described above in the first example.

Preparation of Core-Shell Nanoparticles. The Bi-EDTA complex solution was added drop-wise into a solution containing the functionalized silica particles. The mixture was then heated to 70° C. to promote the complexation of bismuth to the particle surface. Equal molar amount of NaHTe in solution was then added to the particle-containing solution under nitrogen. As formed core-shell nanoparticles were collected, washed with distilled water and ethanol, and dried for future used. The as-prepared core-shell particles were conducted at 300-400° C. under nitrogen or hydrogen (10% $H_2$, 90% $N_2$ V/V) for 1-6 h.

Figure 7A:
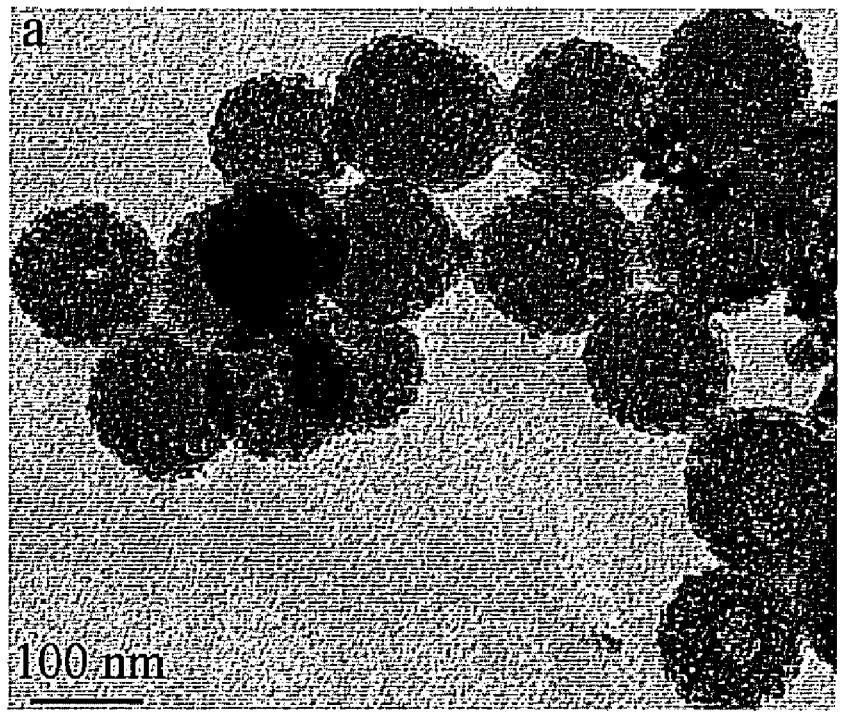
FIGS. 7A and 7B show TEM images of silica core/$Bi_2Te_3$ shell particles before and after annealing.
Figure 7B:
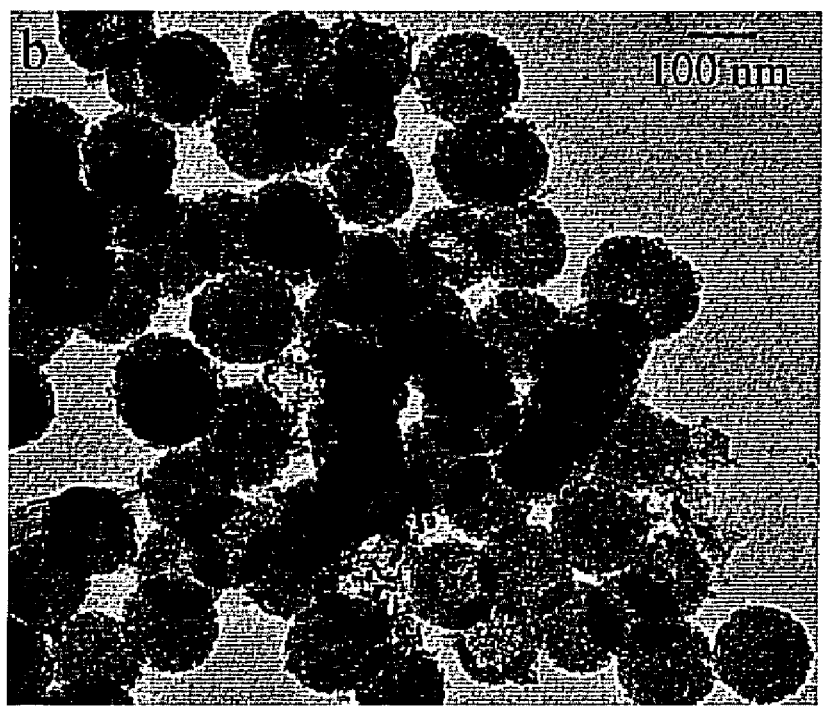

FIG. 7A displays TEM image of as-prepared $SiO_2$ core/$Bi_2Te_3$ shell particles before annealing, which clearly indicates a uniform shell deposited onto the silica cores. FIG. 7B shows the particles after annealing at 400° C. for 4 h under nitrogen. By annealing these particles at moderately high temperature, core-shell particles with a highly crystalline $Bi_2Te_3$ shell. were obtained.

The evidence for formation of core-shell particles is seen in both the electron transmission density (ETD) and energy dispersive X-ray (EDX) analysis recorded on a single particle. The ETD measurements across a sphere show less electron beam transparency at the edges (due to the heavy atoms of $Bi_2Te_3$ shell) than at the center of the particles (due to the silica core).

Figure 8:
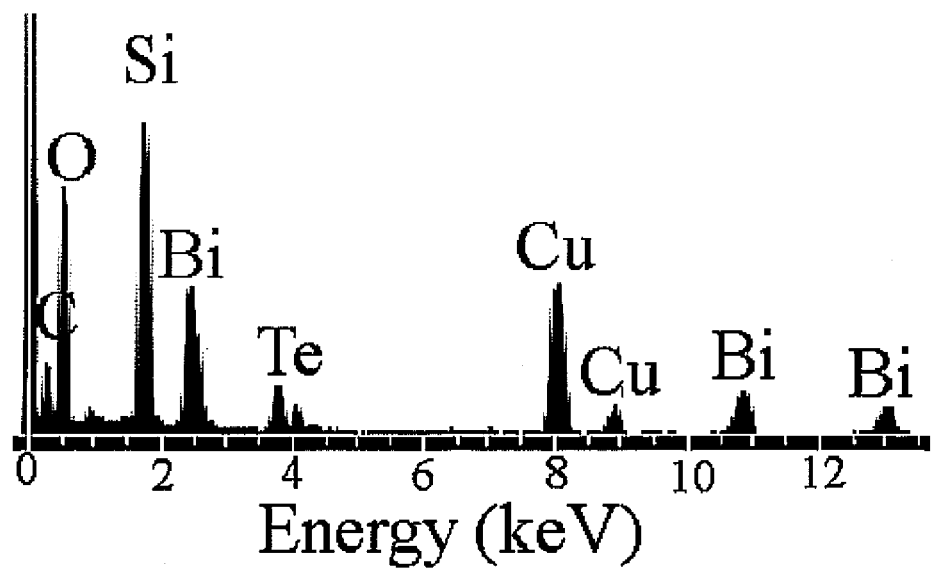
FIG. 8 shows an EDX spectrum of a single annealed $SiO_2$ core/$Bi_2Te_3$ shell particle.

FIG. 8 shows an EDX spectrum of a single annealed $SiO_2$ core/$Bi_2Te_3$ shell particle, which also demonstrates the composite structure of $SiO_2$ with $Bi_2Te_3$. The peaks of C and Cu arise from the TEM grid support.

Figure 9:
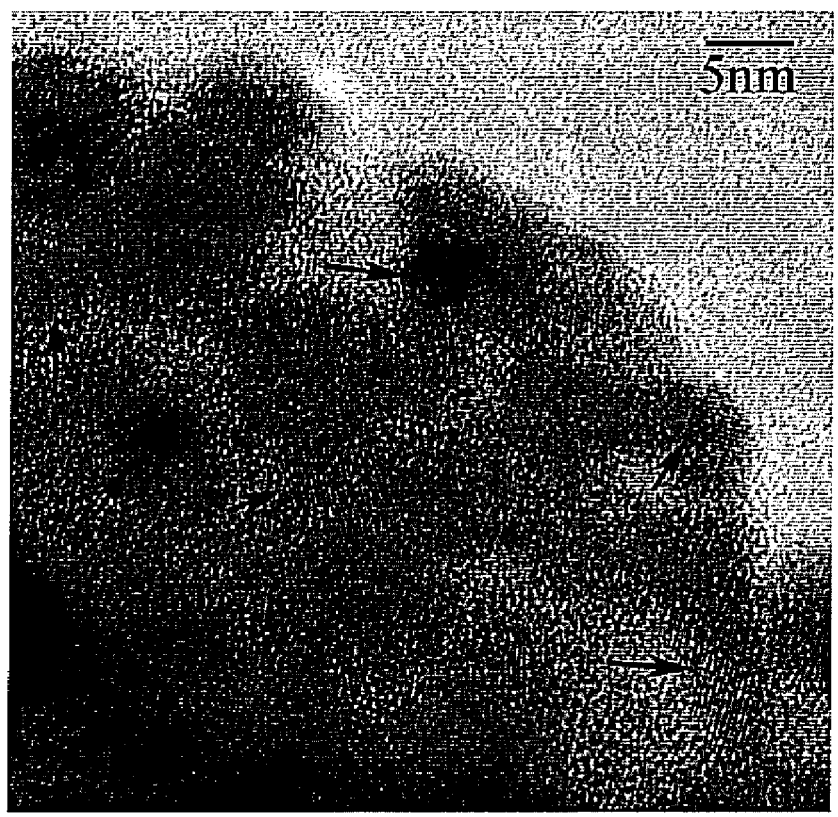
FIG. 9 shows a high-magnification TEM image of part of a $SiO_2$ core/$Bi_2Te_3$ shell particle.

FIG. 9 shows a high-magnification TEM image of a part of as-prepared core-shell particle, in which black arrows show high-crystalline $Bi_2Te_3$ fringes. The image reveals the core-shell structure from both the different electron contrasts of silica core and $Bi_2Te_3$ shell and high-crystalline $Bi_2Te_3$ lattices. The spacing of 0.32 nm of between adjacent lattice planes of shell corresponds to the distance of between two (015) crystal planes of $Bi_2Te_3$, demonstrating $Bi_2Te_3$ shell growth onto silica cores.

EXAMPLE 3

Particles With Carbon or Polysugar Cores and PbTe Shells

The synthesis of carbon or polysugar core PbTe shell particles was achieved by adsorbing Pb ions onto carbon or polysugar spheres prepared by hydrothermally reacting glucose in water, followed by a reducing reaction using NaHTe.

Figure 10:
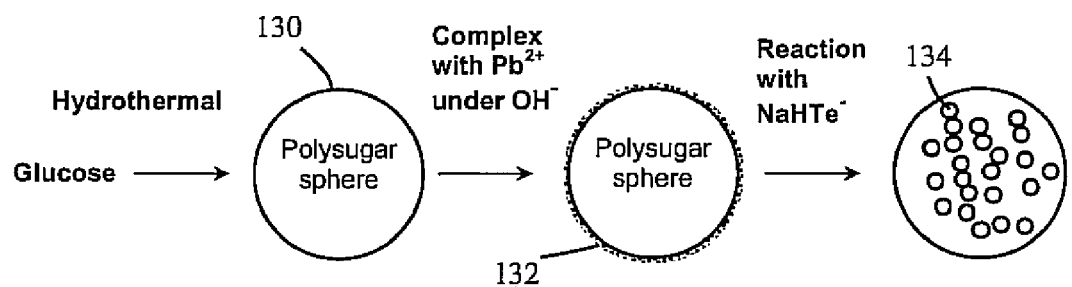
FIG. 10 is a schematic illustration showing preparation of polysugar core-shell particles.

FIG. 10 is a schematic illustration of the process for preparing polysugar core/PbTe shell particles. Glucose turned into polysugar spheres (represented at 130) after hydrothermal treatment. The surface of the polysugar spheres was exposed to metal ions (in this example, $Pb^{2+}$) under basic condition, forming a layer of surface complexed ions (132) on the surface of the polysugar spheres. Exposure to sodium hydrogen telluride formed a layer of lead telluride on the surface of the polysugar spheres, forming the polysugar core/PbTe shell particles (134). This process can be extended to the preparation of other metal chalcogenides, for example by complexing other metal ions on the surface of the sphere, followed by exposure to sodium hydrogen chalcogenide or other chalcogenide compound. The process can be extended to the formation of other shells, including other semiconductor shells.

Figures 11A, 11B, 11C:
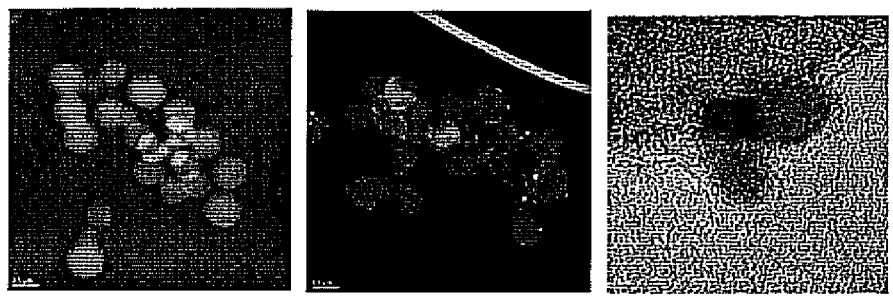
FIGS. 11A-11D are micrographs further illustrating preparation of polysugar-shell particles.
Figure 11D:
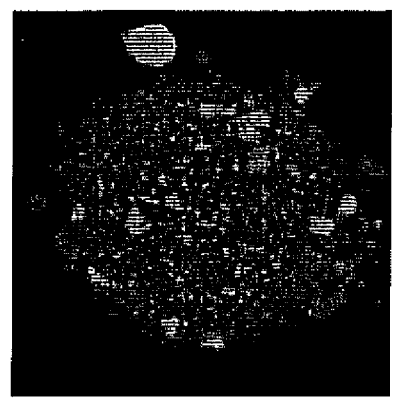

FIG. 11A shows SEM images of the polysugar spheres. The small scale bar in the bottom left represents 0.1 microns. FIG. 11B shows PbTe nanocrystals formed on the surface of polysugar spheres.

In one example, 4 g of glucose was first dissolved in 100 ml DI-water and hydrothermally reacted at 190° C. for 4 h or 175° C. for 8 h. The resulted dark brown sugar spheres were centrifuged and washed using water and alcohol. The sugar spheres were then mixed with $Pb(NO_3)_2$ (1M) and 0.25M NaOH solution under ultrosonication for 24 h, resulting in the formation of Pb/polysugar complexes. As-formed complexes were then centrifuged, washed with distilled water and dispersed in water again. NaHTe solution (0.025M) was then added dropwise under a nitrogen atmosphere. The resulting product was centrifuged and washed using water and alcohol.

Figure 12A:
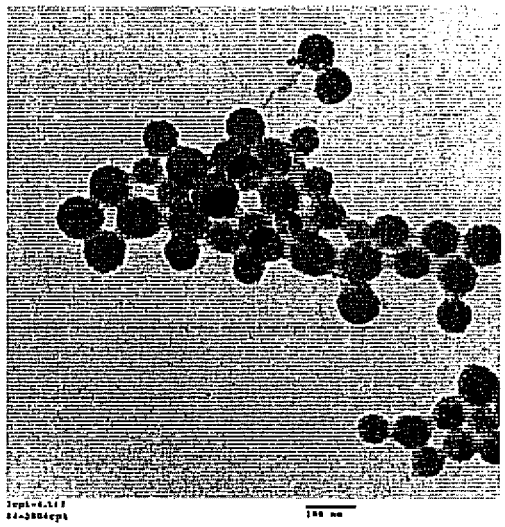
FIGS. 12A-12C are micrographs illustrating the uniformity of as-prepared particles.
Figure 12B:
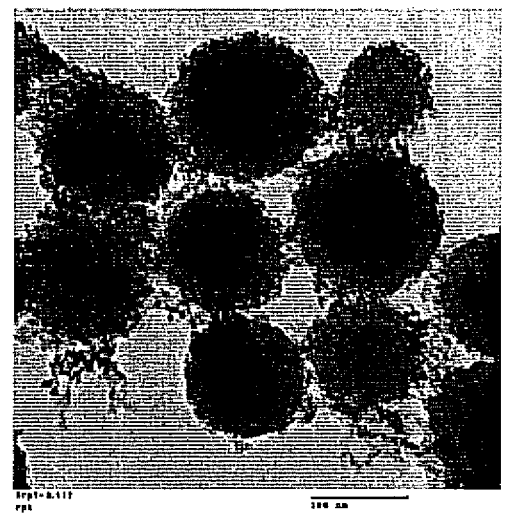
Figure 12C:
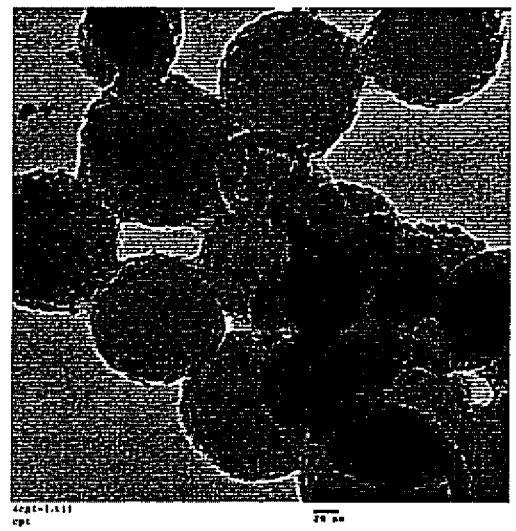

FIG. 12A to FIG. 12C shows electron microscopy images of the spheres, indicting the growth of crystalline PbTe on the polysugar spheres. In FIG. 12B, the scale bar at the lower right represents 100 nm. FIG. 12C shows thicker PbTe shell compared with 12B. The particles are uniform in shape. In FIG. 12C, the scale bar at the lower right represents 20 nm.

Figure 13:
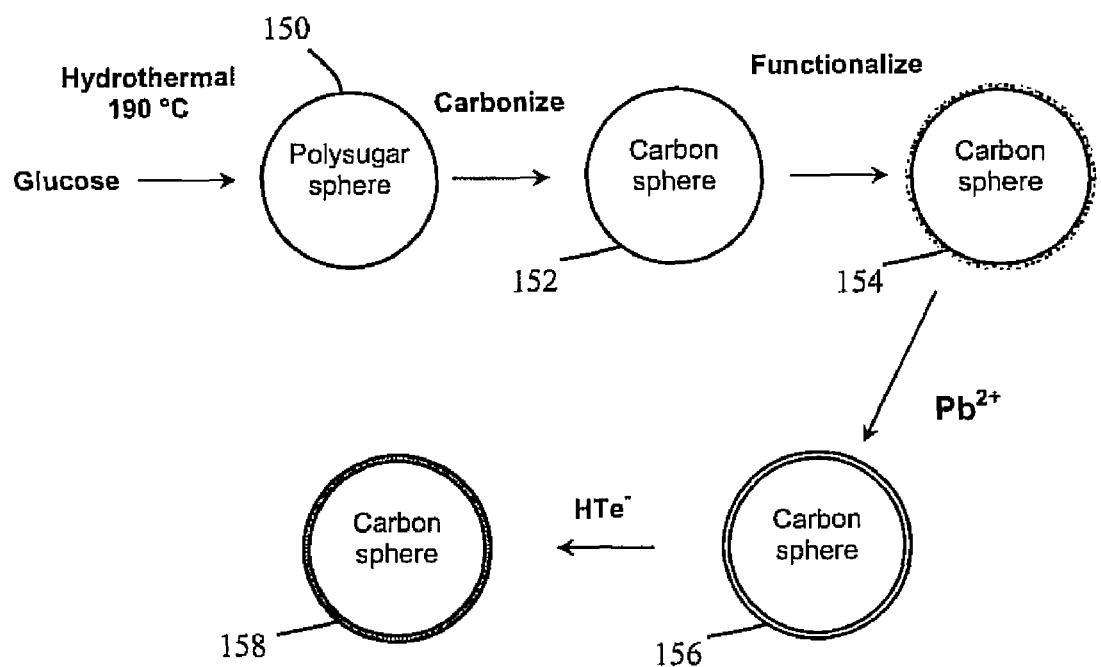
FIG. 13 is a scheme illustrating preparation of carbon core/PbTe shell nanoparticles.

FIG. 13 shows another example scheme for preparation of particles with PbTe shells and carbon cores. First, the colloidal polysugar spheres 150 were prepared from glucose using a hydrothermal process, for example as discussed above. Carbonization of the polysugar spheres creates carbon spheres (152). A subsequent oxidation process generates COOH groups on the carbon spheres, represented by surface layer 154. The functionalized surface adsorbs Pb ions on the sphere surface, to form a surface layer 156. This is followed by a reduction reaction with NaHTe, generating a PbTe shell (158). This process resulted in carbon core/PbTe shell nanoparticles.

Experimentally, the carbon spheres were prepared by dissolving 4 g glucoses in 100 ml distilled water and hydrothermally treating at 190° C. for 4 h. The dark brown precipitates were isolated by centrifugation and cleaned by three cycles of centrifugation/washing/redispersion in water and in alcohol. The as-prepared sugar spheres were carbonized at 900° C. for 4 h under $N_2$. The carbon spheres were then oxidized using nitric acid at 115° C. for one hour.

Figure 14:
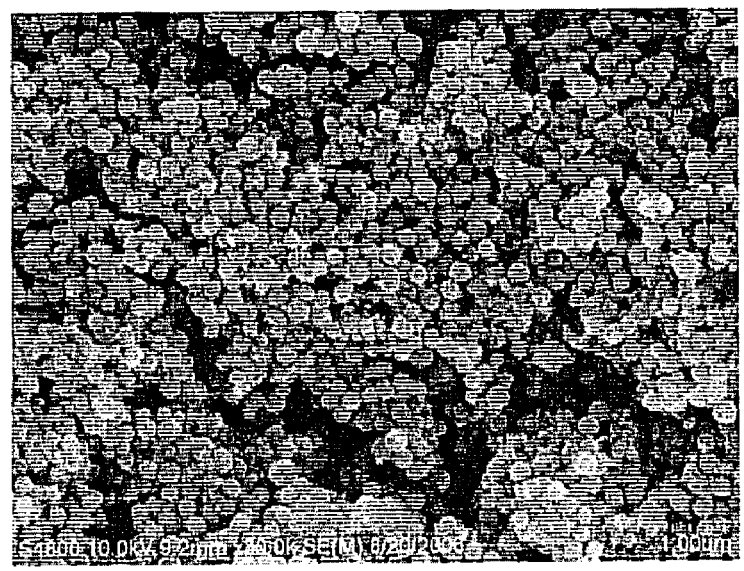
FIG. 14 is an SEM image of the carbon/PbTe nanoparticles showing a homogenous size distribution.
Figure 15:
FIG. 15 is an SEM image of carbon/PbTe core-shell particles prepared by depositing PbTe on to oxidized carbon spheres having COOH groups on the surface.
Figure 16:
FIG. 16 is an SEM image of carbon/PbTe core-shell nanoparticles prepared by depositing PbTe on to polyamine-modified carbon spheres.

FIG. 14 shows scanning electron microscopy images of carbon/PbTe core-shell nanoparticles, indicating the formation of uniform carbon particles with a monodisperse size distribution. The formation of PbTe shell on the particles surface can be readily observed by the enlarged SEM image in FIG. 15. To further increase the surface coverage, polyamines were attached on the carbon surface. Amines can form complexes with many metal ions. The attachment of polyamines improved the surface coverage of PbTe, which results in the formation of thicker PbTe shells. Other amines may be used, FIG. 16 shows a TEM image of the PbTe/carbon nanocomposite particles, clearly indicating the formation of thicker PbTe shells.

Hence, an improved method of preparing polysugar or carbon core/PbTe shell particles comprises functionalizing a surface of polysugar or carbon core materials with lead ions, and further reacting the ions with a tellurium-containing compound, such as a hydrogen telluride, to form a PbTe shell.

An improved method of preparing a core-shell thermoelectric material (or optical material, or semiconductor) comprises providing particles of a core material (such as polysugar, carbon, or other core material), complexing ions to the surface of the core material, and exposing the complexed ions to a second material, the second material and the ions interacting to form a shell on the core material. The core material may be an organic material (such as a carbohydrate such as polysugar), carbon, or other core material described elsewhere. The ions may be, for example, any metal ions, or other inorganic ions, or other ionic species. The particles may be spherical, ovoid, elongate, or other form, and this method may be used to form tubular shells. The second material may be, for example, any alkali hydrogen chalcogenide, other hydrogen chalcogenide, other chalcogenide, other salt, or any material that forms a suitable shell material with the complexed ions.

In particular, bulk materials formed from such polysugar or carbon core/PbTe shell particles are useful for thermoelectric, semiconductor, optical, and other applications.

The various processes described above can be used to synthesize gram quantities of core-shell $SiO_2$ core/$Bi_2Te_3$ shell particles and polysugar/carbon-core/PbTe shell particles for thermoelectric composite applications. The example processes are not limited to making these materials. Enhanced ZT thermoelectric materials may be achieved using such core-shell nanoparticles.

Hollow-core particles may also be formed (for example, by eliminating a core material used to grow the shell, or by growing a shell on a hollow core), and such bulk materials may be considered composite materials of a solid shell and an air core.

The various processes described above can be used to synthesize gram quantities of core-shell $SiO_2$ core/$Bi_2Te_3$ shell particles and carbon-core/PbTe shell particles for thermoelectric composite applications. The processes are not limited to making these materials. Enhanced ZT thermoelectric materials, (such as thermoelectric materials having ZT greater than or approximately equal to 1) may be fabricated using these or other core-shell particles.

Example Shell Materials

Examples of shell materials are now described which may be used in thermoelectric nanocomposites. However, these examples are not intended to be limiting, as other shell materials may be used, and shell materials may also be used for nanoparticles used in applications other than thermoelectric nanocomposites. A nanoparticle may include combinations of several materials, such as mixtures, multi-layer structures, and the like.

The shell material may be a semiconductor (for example, an n-type or p-type doped semiconductor) or other electrical conductor. The shell material may comprise bismuth-tellurium compounds, other semiconductor material, other electrical conductor such as a metal or semi-metal, or any other material having an appreciable bulk thermoelectric effect. Quantum size effects within the shell may advantageously modify the bulk thermoelectric properties of the shell material.

Exemplary shell materials include any conventional bulk thermoelectric material (that is, a material which has appreciable thermoelectric properties in bulk). Materials which could be used for the shell material include tellurides such as lead telluride (e.g. PbTe), bismuth telluride (e.g. $Bi_2Te_3$), antimony telluride (e.g. $Sb_2Te_3$), tin telluride (e.g. SnTe), lanthanum telluride (e.g. $La_2Te_3$), other tellurides such as (Sn,Pb)Te, and the like; bismuth-antimony compounds (which may be referred to as bismuth-antimony alloys or bismuth antimonides); other antimonides such as zinc antimonide (e.g. ZnSb, $Zn_4Sb_3$) and the like; TAGS (alloys of the form $(TeGe)_{1-x}(AgSbTe)_x$, where x~0.2); silicon germanium alloys (Si,Ge); CoSb alloys such as $CoSb_3$, which may also be referred to as cobalt antimonides, and CeFeCoSb alloys. Shell materials may comprise skutterudite materials such as $CoSb_3$ (mentioned above), $LaFe_3CoSb_{12}$ and $CeFe_3CoSb_{12}$.

For example, the shell material may be any semiconductor chalcogenide, the term chalcogenide here referring to sulfides, selenides and tellurides, or a semiconductor antimonide.

The shell material can be an electrically conducting material such as a semiconductor or metal. The shell material can be an inorganic material, or an organic material such as a conducting polymer or organic semiconductor.

The shell material may be chosen based on a typical operating temperature range of a thermoelectric device. For example, in the temperature range 300 K>T>500 K, an n-type shell material can be $Bi_2Te_3$ or $Bi_2Se_3$ and a p-type shell material can be $Bi_2Te_3$ or $Sb_2Te_3$. For the temperature range 500 K>T>700 K, an n-type shell material can be PbTe or SnTe doped with Bi, and a p-type shell material can be PbTe or SnTe. However, these and any other examples are not limiting. A thermoelectric material may also have layers of different composition, for example including different shell materials, for example where there is a large temperature gradient so as to select different materials according to different ranges of temperatures they may be exposed to.

A metal nanostructured network can also be used, in place of or in addition to a semiconductor nanostructured network, for example using shell materials including Ag, Au, Co, Cu, Fe, Ni, Pd, or Pt, or other metal (such as a transition metal), or alloy thereof. For example, a metal nanostructure can be used in an n-type region of a nanocomposite.

Example Core Materials

Examples of core materials are now described which may be used in thermoelectric nanocomposites. However, these examples are not intended to be limiting, as other core materials may be used, and such core materials may also be used in applications other than thermoelectric nanocomposites.

For thermoelectric materials, the core material may have a thermal conductivity substantially lower than that of the shell material, for example at least 10 times lower, or 100 times lower, or more orders of magnitude lower. Materials with low thermal conductivity are typically also poor electrical conductors, and so the core material may be an electrical insulator such as silica. The core material can be an electrical insulator, such as a dielectric. For example, the core material can be an inorganic oxide such as silica, alumina, and the like.

Example core materials include inorganic, non-metallic materials, such as electrical insulators, including inorganic compounds of metallic and nonmetallic elements, such as aluminum and oxygen (e.g. aluminum oxide or alumina, $Al_1O_3$), calcium and oxygen (e.g. calcium oxide, CaO), silicon and nitrogen (e.g. silicon nitride, $Si_3N_4$), silicon and oxygen (silica, $SiO_2$), and silicon and carbon (e.g. silicon carbide), and the like. The core material may be a glass. Other example core materials include insulating inorganic oxides.

Core material examples include silica ($SiO_2$), alumina ($Al_2O_3$), $SnO_2$, ZnO, $LaCoO_4$, $NaCoO_4$, $(ZnO)_x(In_2O_5)_y$, yttrium oxide (such as yttria $Y_2O_3$), zirconium oxide (such as zirconia $ZrO_2$), stabilized zirconia such as yttria stabilized zirconia (YSZ), $La_2O_3$ stabilized YSZ, titanium oxide (such as $TiO_2$), cerium oxide, magnesium oxide, calcium oxide, other oxide materials such as mixed oxides, including mixed oxides of one or more of the oxides otherwise provided herein. Other core material examples include carbon nanotubes, polysugar, carbon, fullerenes such as $C_{60}$, polymers including electrically insulating polymers, and gases (such as air, nitrogen, inert gases) for example in voids or porous core materials.

However, it should be understood that other low thermal conductivity materials can be used, such other oxides, nitrides, oxynitrides, carbides, silicides, borides, and the like. The core material may be electrically conducting.

Example core materials include non-electrically conducting and poorly electrically conducting materials. In other examples, the core material can be an electrically conductive inorganic oxide such as ZnO, or even a thermoelectric ceramic, for example to improve the electrical conductivity. Other examples include such as air (such as bubbles or other voids in a core), or a porous material such as porous $Bi_2Te_3$.

In some examples of the present invention, the core material has a lower thermal conductivity than the shell material, in some examples substantially lower.

Representative examples of core-shell nanoparticles having $Bi_2Te_3$ as the shell material include $Bi_2Te_3/SiO_2$, $Bi_2Te_3/$PbTe, $Bi_2Te_3/ZnO$, $Bi_2Te_3$/carbon nanotubes, $Bi_2Ti_3$/carbon, and $Bi_2Te_3$/air, in these examples the core material being after the slash.

The core material may also include defects, heavy atoms, or other features included so as to increase phonon scattering and reduce thermal conductivity.

The core material may also include a material that has a lattice structure similar to the shell material. For example, a core-shell particle may have a CdTe core and a PbTe shell.

The core may comprise a thermoelectric material. An example thermoelectric; nanocomposite comprises core-shell nanoparticles, the shell comprising a first thermoelectric material, and the core comprising a second thermoelectric material. The thermoelectric properties may be improved over that obtainable from a bulk sample of either the first or second thermoelectric material, due to one or more effects such as quantum size effects in the shell and/or the core, phonon scattering, and the like. Thermoelectric properties may be further enhanced by additional nanocomposite components, including interparticle voids.

Size Ranges

Composites having improved homogeneity may be formed from core-shell particles having any combination of core diameter and shell thickness, so the size ranges described are representative and not limiting. For thermoelectric nanocomposites, the shell thickness may be chosen to be less than the phonon mean free path within the shell material.

In representative examples, the shell has at least one physical dimension (such as the thickness of the shell) in the range 0.5-10,000 nm (10 microns), more particularly in the range 1 nm-500 nm, even more particularly in the range 1 nm-50 nm. All ranges are inclusive of given limits, and both upper and lower limits may be approximate.

In some examples of the present invention, the core may have a diameter in the range 1 nm to 10 micron, more particularly between approximately 1 nm and approximately 500 nm.

For a thermoelectric nanocomposite in which the core is not a material having appreciable thermoelectric properties, the dimensions of the core-shell nanocomposite may be chosen so that the core material is less than 50% of the nanocomposite, by volume.

Core-shell particles may be particles having at least one dimension (such as the overall diameter) having at least one physical dimension of approximately 0.5-1000 nm, more particularly approximately 1-500 nm.

In some examples of the present invention, the shell thickness may be approximately between 1% and 50% of the overall particle diameter, for example approximately between 1% and 40%.

In some examples, the shell comprises a metal or semimetal (including alloys), and the shell thickness is chosen to induce a metal/semimetal to semiconductor transition desirable for thermoelectric applications, for example in the range from 0.5 nm to 500 nm.

Material Doping

Shell materials may be doped to obtain n-type or p-type semiconductor properties, as is known in the electronic arts. A thermoelectric device may comprise a first unicouple comprising a first thermoelectric material, the first thermoelectric material including core-shell particles having an n-type semiconductor shell material, and a second unicouple comprising a second thermoelectric material, the second thermoelectric material including core-shell particles having a p-type semiconductor shell material.

The outer layer of an intrinsic semiconductor particle may be doped, so as to form an n-type or p-type shell on an intrinsic core.

Monolithic Thermoelectric Materials Formed From Core-shell Particles

The prepared core-shell particles may be subjected to a consolidation process, which consolidates a loose powder into a monolithic form. The consolidation process may include application of pressure, temperature, and/or radiation to the mixture. Consolidation processes include hot isostatic pressing (HIP), hot uniaxial pressing, hot pressing, cold isostatic pressing, spark plasma sintering (SPS), other pressing techniques, laser irradiation (e.g. laser sintering), microwave irradiation, irradiation by other electromagnetic radiation, ultrasound irradiation, shock compression or sintering, melting of one or more component (including softening or surface melting), electric field sintering, plasma sintering, or other technique or combination of techniques.

Thermoelectric materials may include core-shell particles as described elsewhere, along with additional particles or additional materials provided in any form. A bulk composite thermoelectric material may be formed from consolidation of: core-shell particles; a particle mixture including core-shell particles and other particles, such as particles having a diameter in the range 0.5 nm-10 microns; or any other starting material combination including core-shell particles.

For example, a particle mixture may include core-shell particles combined with semiconductor particles and/or particles of the core material without a shell. A particle mixture may include core-shell particles and nanoparticles of the shell material. Consolidation processes used may include hot pressing, hot isostatic pressing, sintering, and the like.

Additional components can be incorporated into a thermoelectric material according to the present invention, for example to further lower thermal conductivity. Additional components may include insulating oxide particles, such as uncoated silica nanoparticles. Additional materials such as $SiO_2$, yttria stabilized zirconia and $La_2O_3$-doped YSZ can be used. However, the invention is not limited to these examples.

Additional components may be selected to modify physical, mechanical, electrical, or thermal properties, for example to assist the formation of nanostructures, reduce thermal conductivity, increase electrical conductivity, and/or for any other purpose. Additional components may optionally be used to fill voids in the thermoelectric material, The overall thermal conductivity of a composite thermoelectric may be less than any single component due to the formation of nanoscale networks within the composites.

OTHER EXAMPLES

Examples discussed used spherical cores. However, cores may be elongate, and may include rod-lice structures, such as core-shell particles with a cylindrical core. In some examples, the diameter of the cylinder may be in the range 1 nm-10 microns, and the shell thickness in the range 1 nm-500 nm. The long axis dimension of the cylinder may be substantially longer than the diameter, for example in the range 100 nm-100 microns. The core may include a fullerene, such as a spherical or ovoid fullerene, or a carbon nanotube.

Other Fabrication Methods

The particle synthesis methods described herein are exemplary. Core-shell particles may be prepared by other methods. For example, a shell layer may be formed by surface modification of a particle of the core material. For example, surface doping may be used to obtain an n-type or p-type semiconductor shell on an intrinsic semiconductor core. Dopant atoms may be diffused into the surface of a particle, so that the shell is the doped region of the particle, and the core is the undoped region.

A shell can be formed on a core material using approaches such as vapor deposition, plating, surface reactions in gas or liquid media, other deposition processes, and the like. The shell may be additional material formed on the core, or a material that is a modification of what was originally core material.

Other Applications

Materials and devices according to the present invention can also be used in Peltier effect thermoelectric applications, for example in applications such as cooling of electronic components and devices, food and beverage refrigeration, atmospheric conditioning such as air conditioning and dehumidifiers, personal cooling devices carried by individuals in hot climates, respiration gas conditioning, and the like, and heating applications analogous to those already mentioned (for example, as an air heater in a vehicle, or a de-icer on an airplane). A device may be used for both Peltier and Seebeck effect applications within a vehicle, for example to provide electrical energy from thermal gradients, and for air conditioning. A unitary device may include a Seebeck effect device designed to provide electricity from thermal gradient, and to provide cooling or heating of an air flow to a passenger compartment.

Polymer Nanocomposites

Core-shell nanoparticles can be used to form homogeneous nanocomposites for other applications, such as energy storage devices such as a battery or fuel cell.

An improved method of making a polymer nanocomposite membrane comprises preparing core-shell nanoparticles having a core material and a polymer shell, and consolidating the core-shell nanoparticles into a polymer nanocomposite membrane. The consolidation step may include application of heat and/or pressure to the nanoparticles to induce formation of a structurally coherent membrane.

A method of preparing a nanocomposite material comprises providing a plurality of core particles, the core particles comprising a core material; functionalizing the surface of each core particle; growing a shell on a functionalized surface of each particle to provide a plurality of core-shell particles, the shell comprising a shell material; and consolidating the core-shell particles into a bulk nanocomposite material. The nanocomposite may be a thermoelectric material, optical material, semiconductor, or an ion-conducting membrane for a fuel cell, where in the latter case the shell material may an ion-conducting material, such as an ion-conducting polymer.

For example, for a PEM fuel cell, a nanocomposite membrane may be formed with a membrane thickness may be in the range 1 micron-500 microns, such as approximately 50 microns. The core material may be a core material as described elsewhere in this specification, such as silica or other oxide material. The resultant membrane may have reduced gas diffusion compared with conventional membranes. Hence, an example improved ion-conducting membrane comprises (or is prepared using) core-shell particles, having a shell formed from an ion-conducting material, where in some examples the core material having a lower ion conductivity than the shell material, possibly not having a significant ion conductivity.

Core-shell nanoparticles can be used to form homogeneous nanocomposites for various applications, including nanostructured components (such as a nanostructured polymer electrolyte membrane, nanostructured electrode, or nanostructured catalyst) for an energy storage device such as a battery or fuel cell Example applications for nanocomposites including core-shall particles include electrodes for a battery, and fuel cell applications such as catalyst shell/carbon core nanoparticles, catalyst/other electrode material core shell nanoparticles, and the like. Examples include carbon cores with shells of platinum, other transition metal, or other metal or catalyst material.

OTHER EXAMPLES

Further, the use of core-shell nanoparticles allows fabrication of other materials, including alloys, having improved homogeneity compared with conventional materials, For example, nanoparticles may comprise a core material that is a first metal, and a shell material that is a second metal. Consolidation of the nanoparticles allows formation of a nanostructured metal material with improved uniformity in the distribution of metal components.

Further treatment of a nanostructured material, such as heating, allows alloys with improved spatial distribution of composition to be formed. In comparison, uniform mixing of powders including separate particles of first and second materials is technological challenging. Hence, nanocomposite uniformity may be enhanced using core-shell nanoparticles.

Hence, an improved process for making a nanostructured metal or metal alloy comprises providing core shell nanoparticles having a core formed from a core material, and a shell formed from a shell material, and consolidation of the core-shell nanoparticles into the nanostructured metal or metal alloy. Consolidation may include application of heat and/or pressure. The core-shell structures may remain in a nanostructured material, or local mixing of the first and second components may occur, for example in the formation of an alloy by heating the core-shell nanoparticles.

An improved general process for forming a composite material comprising at least first and second components includes providing core-shell particles having a core of the first component and a shell of the second component, and consolidating the particles into a monolithic composite. As describe above, metal core-shell particles may be useful in forming alloys, or nanostructured metal materials.

Further, the use of non-electrically-conducting cores is useful for obtaining uniform distribution of a non-conducting core material through a conducting medium. Such composite materials are useful for reduced weight conducting elements, conductive coatings, conducting membranes, and the like.

In other examples, the core material may be an optical material or optical device, such as glass, or a pigment, to obtain optical materials (such as filters, photonic materials, synthetic opals, and the like) or other materials with desired optical properties.

Materials prepared using methods according to the present invention can also be used in applications such as light-emitting diodes, lasers, optical and IR detectors, transistors such as field-effect detectors, static electric field detectors, resonant tunneling diodes, photonic bandgap structures, optical waveguides, optical couplers, chemical sensors, other nanocomposites, other semiconductor and/or optical devices, and the like. Nanostructured materials according to embodiments of the present invention may also be used in the formation of photonic materials.

Other applications of thermoelectric materials, thermoelectric devices, and other materials and devices according to the present invention will be clear to those skilled in the art. Applications of thermoelectric devices and materials according to embodiments of the present invention include electrical power generation in vehicles such as automobiles, airplanes, and spacecraft. A thermal gradient can be provided by operation of an engine, burning fuel, solar energy, or other source of energy, providing electrical power to a vehicle.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

Having described our invention, we claim:

1. A thermoelectric device, comprising:
a first electrical contact;
a second electrical contact; and
a thermoelectric material located in an electrical path between the first electrical contact and the second electrical contact,
the thermoelectric material being a nanocomposite material formed from core-shell particles,
the core-shell particles having a core including a core material and a shell including a shell material,
wherein the core material is a polysugar, and
the shell material is a semiconductor.

2. The thermoelectric device of claim 1, wherein the shell material is a chalcogenide.

3. The thermoelectric device of claim 1, wherein the shell material is lead telluride.

4. A method of preparing a thermoelectric device including a nanocomposite material, the method comprising:
providing a plurality of core particles, the core particles each including a core material and having a surface;
functionalizing the surface of each core particle so that the surface supports a first compound;
exposing functionalized core particles to a second compound, the first compound and second compound reacting to form a shell material on the surface of each core particle,
so as to provide a plurality of core-shell particles, having a shell comprising the shell material;
consolidating the core-shell particles into the nanocomposite material; and
fabricating the thermoelectric device using the nanocomposite material, by locating the nanocomposite material in an electrical path between a first electrical contact and a second electrical contact.

5. The method of claim 4, wherein the core material is an oxide.

6. The method of claim 4, wherein the core material is carbon.

7. The method of claim 4, wherein the shell material is a semiconductor.

8. The method of claim 7, wherein the shell material is a chalcogenide.

9. The method of claim 1, wherein the shell material is telluride.

10. The method of claim 4, wherein the core material is a polysugar.

11. The method of claim 10, further including carbonizing the polysugar.

12. The method of claim 4, wherein the first compound includes a metal ion complexed to the surface of the core, the shell material being a reaction product of a metal ion.

13. The method of claim 12, wherein the second compound is a chalcogenide, the reaction product being a chalcogenide.

14. The method of claim 4, wherein the second compound is a chalcogenide, the shell material being a chalcogenide.

* * * * *

UNITED STATES PATENT AND TRADEMARK OFFICE
CERTIFICATE OF CORRECTION

| | | |
|---|---|---|
| PATENT NO. | : 8,044,292 B2 | Page 1 of 1 |
| APPLICATION NO. | : 11/549203 | |
| DATED | : October 25, 2011 | |
| INVENTOR(S) | : Qiangfeng Xiao et al. | |

It is certified that error appears in the above-identified patent and that said Letters Patent is hereby corrected as shown below:

Column 7, line number 6 after "particles" insert --(--.

Column 8, line number 17 after "$Bi_2 Te_3$ shell" delete ".".

Column 9, line number 47 delete "," insert --.--.

Column 12, line number 20 after "thermoelectric" delete ";".

Column 12, line number 60 "semimnetal" should read --semimetal--.

Column 13, line number 52 delete "," insert --.--.

Column 15, line number 9 after "cell" insert --.--.

Signed and Sealed this
Twenty-fourth Day of April, 2012

David J. Kappos
*Director of the United States Patent and Trademark Office*